US012476072B2

(12) United States Patent
Gamm et al.

(10) Patent No.: US 12,476,072 B2
(45) Date of Patent: Nov. 18, 2025

(54) OPERATING A PARTICLE BEAM APPARATUS

(71) Applicant: Carl Zeiss Microscopy GmbH, Jena (DE)

(72) Inventors: Bjoern Gamm, Koenigsbronn (DE); Christian Birle, Deiningen (DE)

(73) Assignee: Carl Zeiss Microscopy, GmbH, Jena (DE)

( * ) Notice: Subject to any disclaimer, the term of this patent is extended or adjusted under 35 U.S.C. 154(b) by 874 days.

(21) Appl. No.: 17/592,567

(22) Filed: Feb. 4, 2022

(65) Prior Publication Data

US 2022/0384140 A1 Dec. 1, 2022

(30) Foreign Application Priority Data

Feb. 8, 2021 (DE) ......................... 102021102900.7

(51) Int. Cl.

*H01J 37/26* (2006.01)
*H01J 37/10* (2006.01)
*H01J 37/147* (2006.01)
*H01J 37/28* (2006.01)

(52) U.S. Cl.

CPC ............ *H01J 37/265* (2013.01); *H01J 37/10* (2013.01); *H01J 37/1474* (2013.01); *H01J 37/28* (2013.01); *H01J 2237/2487* (2013.01)

(58) Field of Classification Search

CPC .. H01J 37/00; H01J 37/02; H01J 37/26; H01J 37/265; H01J 37/28; H01J 37/1474; H01J 37/10; H01J 2237/304; H01J 2237/28; H01J 2237/2487; G01N 23/2251; G01N 23/04

USPC .......................................... 250/306, 307, 311

See application file for complete search history.

(56) References Cited

U.S. PATENT DOCUMENTS 4,567,369 A * 1/1986 Smith .................. H01J 37/153 250/397
5,032,725 A * 7/1991 Kanda ..................... H01J 37/21 250/311
2001/0030287 A1 10/2001 Tsuyuki
2004/0036031 A1 2/2004 Rose et al.
2004/0108459 A1 6/2004 Furukawa et al.
2009/0242794 A1 10/2009 Inada et al.
2010/0320385 A1 12/2010 Kitsuki et al.

FOREIGN PATENT DOCUMENTS

WO WO 02/067286 A2 8/2002

* cited by examiner

*Primary Examiner* — Jason L McCormack
(74) *Attorney, Agent, or Firm* — Westborough IP Group, LLC

(57) ABSTRACT

A particle beam apparatus is used for imaging, processing and/or analyzing an object. A computer program product may be used to facilitate imaging, processing and/or analyzing the object. A magnification may be chosen from a first magnification range of the particle beam apparatus by driving a first amplifier unit and a second amplifier unit. If it is established that there are prerequisites which would actually result in the particle beam apparatus being switched to a different magnification from a second magnification range, the switching is avoided by feeding an analog amplifier signal from an amplifier unit to a scanning unit of the particle beam apparatus, guiding the particle beam over the object using the scanning unit, and imaging, processing and/or analyzing the object with the particle beam.

8 Claims, 9 Drawing Sheets

OPERATING A PARTICLE BEAM APPARATUS

CROSS-REFERENCE TO RELATED APPLICATIONS

This application claims the priority of the German patent application No. 10 2021 102 900.7, filed on Feb. 8, 2021, which is incorporated by reference herein.

TECHNICAL FIELD

The system described herein relates to operating a particle beam apparatus for imaging, analyzing and/or processing an object and more particularly to a particle beam apparatus that is embodied for example as an electron beam apparatus and/or as an ion beam apparatus.

BACKGROUND

Electron beam apparatuses, in particular a scanning electron microscope (also referred to as SEM below) and/or a transmission electron microscope (also referred to as TEM below), are used to examine objects (also referred to as samples below) in order to obtain knowledge with respect to the properties and the behavior under certain conditions.

In an SEM, an electron beam (also referred to as primary electron beam below) is generated using a beam generator and focused onto an object to be examined by way of a beam guiding system. The primary electron beam is guided over a surface of the object to be examined using a deflection device in the form of a scanning device. Here, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An image representation of the object to be examined is thus obtained. Furthermore, interaction radiation, for example x-ray radiation or cathodoluminescent light, is generated during the interaction and, for the analysis of the object, is detected using a detector and subsequently evaluated.

In the case of a TEM, a primary electron beam is likewise generated using a beam generator and guided onto an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Here, imaging can also take place in the scanning mode of a TEM. As a rule, such a TEM is referred to as STEM. Additionally, provision can be made for detecting electrons backscattered at the object to be examined and/or secondary electrons emitted by the object to be examined using a further detector in order to image an object to be examined.

Combining the functions of a STEM and an SEM in a single particle beam apparatus is known. It is therefore possible to carry out examinations of objects with an SEM function and/or with a STEM function using this particle beam apparatus.

Moreover, a particle beam apparatus in the form of an ion beam column is known. Ions used for processing an object are generated using an ion beam generator arranged in the ion beam column. By way of example, material of the object is ablated, or a material is applied onto the object during the processing, for example with gas being fed in the process. The ions are used, additionally or alternatively, for imaging.

Furthermore, it is known from the prior art to use combination apparatuses for examining objects, wherein both electrons and ions can be guided onto an object to be examined. By way of example, it is known to additionally equip an SEM with an ion beam column. An ion beam generator arranged in the ion beam column generates ions that are used for preparing an object (for example ablating material of the object or applying material to the object) or else for imaging. For this purpose, the ions are scanned over the object using a deflection device in the form of a scanning device. The SEM serves here in particular for observing the preparation, but also for further examination of the prepared or unprepared object.

As already mentioned above, it is known from the prior art to guide a particle beam over the surface of an object to be examined using a deflection device in the form of a scanning device. The known scanning device has a control unit, a digital-to-analog converter, a first amplifier unit in the form of a preamplifier, a second amplifier unit in the form of a main amplifier, and a deflection unit in the form of a scanning unit. A digital control signal is passed from the control unit to the digital-to-analog converter using a first signal line, which connects the control unit to the digital-to-analog converter. The digital control signal is used for guiding the particle beam over the object. Furthermore, an analog control signal is generated on the basis of the digital control signal using the digital-to-analog converter. The analog control signal is passed from the digital-to-analog converter to the first amplifier unit using a second signal line. The second signal line connects the digital-to-analog converter to the first amplifier unit. An analog first amplifier signal is generated on the basis of the analog control signal using the first amplifier unit. The analog first amplifier signal is passed from the first amplifier unit to the second amplifier unit using a third signal line. The first amplifier unit is arranged between the digital-to-analog converter and the second amplifier unit. The third signal line connects the first amplifier unit to the second amplifier unit. An analog second amplifier signal is generated on the basis of the analog first amplifier signal using the second amplifier unit. The analog second amplifier signal is passed from the second amplifier unit to the scanning unit using a fourth signal line. The fourth signal line connects the second amplifier unit to the scanning unit. The particle beam is then guided over the object using the scanning unit. This is followed by imaging, processing and/or analyzing the object with the particle beam.

The known scanning unit has a first coil unit and a second coil unit. The particle beam is scanned over the surface of the object using the first coil unit and the second coil unit. The first coil unit acts in a first direction and the second coil unit acts in a second direction oriented perpendicular to the first direction. The first coil unit includes a first pair of coils. By contrast, the second coil unit includes a second pair of coils.

The abovementioned second amplifier unit of the known scanning device makes available the analog second amplifier signal used for driving the first coil unit and the second coil unit. The first amplifier unit and the second amplifier unit can be driven in such a way that the particle beam apparatus is operated in a first magnification range. To put it another way, the particle beam apparatus has a magnification from the first magnification range. The first magnification range includes magnifications from a specific range. By way of example, the first magnification range includes magnifications in the range of 10-fold to at least 500-fold. Furthermore, the first amplifier unit and the second amplifier unit can be driven in such a way that the particle beam apparatus is operated in a second magnification range. To put it another way, the particle beam apparatus has a magnification from the second magnification range. The second magnification range includes magnification from a specific range. By way of example, the second magnification range includes magnifications of more than 500-fold to at least 20000-fold.

The analog second amplifier signal is an AC current. If the particle beam apparatus is operated on a small magnification (for example 10-fold) from the first magnification range, then the analog second amplifier signal is large and has an amplitude in the range of a few amperes, for example in the range of 1 A to 3 A. The greater the magnification of the particle beam apparatus is chosen to be, the smaller the analog second amplifier signal which is generated for driving the scanning unit and which is fed to the scanning unit. It can happen that in the case of a greater magnification (for example greater than 500-fold) the analog second amplifier signal is so small that the analog second amplifier signal lies in the electronic background noise of the known scanning device. This can result in errors when guiding the particle beam to the object. In particular, it can happen that the particle beam would not be guided exactly to the location on the object to which the particle beam should actually be guided. This results in errors when imaging, processing and/or analyzing the object. In order to avoid these errors, it is known for the magnification of the particle beam apparatus to be switched to a different magnification in a different magnification range. To put it another way, during switching the first amplifier unit and the second amplifier unit are driven in such a way that the particle beam apparatus is no longer operated in the first magnification range, but rather in the second magnification range, such that the analog second amplifier signal no longer lies in the electronic background noise of the known scanning device.

During the abovementioned switching, however, disturbance effects that influence the analog second amplifier signal can occur on account of charges and different loadings of electronic components of the scanning device. This can result in unwanted effects when imaging, processing and/or analyzing the object with the particle beam. In particular, imaging aberrations occur, which are evident for example as a sudden change in an image generated from the object.

SUMMARY OF THE INVENTION

It is desirable to avoid unwanted effects when imaging, processing and/or analyzing the object with the particle beam.

The system described herein provides for operating a particle beam apparatus for imaging, processing and/or analyzing an object with a particle beam having charged particles. The charged particles are electrons or ions, for example. The particle beam apparatus is embodied for example as an electron beam apparatus and/or as an ion beam apparatus.

The system described herein involves choosing a magnification from a first magnification range of the particle beam apparatus by driving a first amplifier unit and a second amplifier unit using a control unit of the particle beam apparatus. The aforementioned magnification is basically the magnification of the object. To put it another way, the aforementioned magnification is the ratio of the size of the generated image and the actual size of the object to one another. By way of example, the magnification lies in a total range of 10-fold to 2000000-fold. The first magnification range and the second magnification range are subranges of the total range. It is explicitly pointed out that the system described herein is not restricted to the total range mentioned above. Rather, any total range of magnifications which is suitable can be used.

Furthermore, the method according to the system described herein involves feeding a digital control signal from the control unit to a digital-to-analog converter of the particle beam apparatus using a first signal line, which connects the control unit to the digital-to-analog converter. The digital control signal serves for guiding the particle beam over the object.

Furthermore, the method according to the system described herein involves generating an analog control signal on the basis of the digital control signal using the digital-to-analog converter. The analog control signal is passed from the digital-to-analog converter to the first amplifier unit of the particle beam apparatus using a second signal line. The second signal line connects the digital-to-analog converter to the first amplifier unit.

The method according to the system described herein also includes generating an analog first amplifier signal on the basis of the analog control signal using the first amplifier unit. The analog first amplifier signal is passed from the first amplifier unit to the second amplifier unit of the particle beam apparatus using a third signal line. The first amplifier unit is arranged between the digital-to-analog converter and the second amplifier unit. The third signal line connects the first amplifier unit to the second amplifier unit. An analog second amplifier signal is generated on the basis of the analog first amplifier signal using the second amplifier unit.

Furthermore, the method according to the system described herein involves determining, using the control unit of the particle beam apparatus, whether the chosen magnification from the first magnification range deviates from a limit of a second magnification range with a deviation, wherein the first magnification range and the second magnification range are different. The first magnification range includes magnifications of the particle beam apparatus which are less than magnifications of the particle beam apparatus from the second magnification range. To put it another way, a check is made to establish whether the chosen magnification from the first magnification range is separated by a margin from the limit of the second magnification range and/or lies in a predefinable range between the limit of the second magnification range and a predefinable magnification of the first magnification range. This is discussed in even greater detail further below.

The method according to the system described herein also includes determining whether a number of pixels on the surface of the object to which the particle beam is intended to be guided falls below a predefinable pixel threshold value. By way of example, the predefinable pixel threshold value is a predefinable number of pixels, in particular 4096 or 16384. As an alternative thereto, provision is made for the pixel threshold value to be a ratio of a first number of pixels to a second number of pixels, as explained in even more specific detail further below.

It is known that a first magnification range has a first static deflection range attained by a first static DC current as second amplifier signal. The first deflection range is the region on the object to which the particle beam is guidable using the first static DC current. Furthermore, it is known that a second magnification range has a second static deflection range attained by a second static DC current as second amplifier signal. The second deflection range is the region on the object to which the particle beam is guidable using the second static DC current. By way of example, the amplitude of the first static DC current is 1 A. By contrast, the amplitude of the second static DC current is 0.2 A, for example. If a chosen deflection of the particle beam in the first magnification range causes a driving with an amplitude of more than 0.2 A, then it is not possible to attain the chosen deflection in the second magnification range.

The method according to the system described herein then provides for carrying out specific steps without switching the magnification from the first magnification range to a magnification from the second magnification range, if specific conditions are met.

One of the conditions is that the chosen magnification from the first magnification range deviates from the limit of the second magnification range with the abovementioned deviation and that the deviation is less than a predefinable value. The predefinable value is 10, for example, which states that the predefinable value differs from the abovementioned limit by 10 magnification values. The limit and the predefinable value define a limit range. If the chosen magnification lies in the limit range, then the deviation of the chosen magnification is less than the predefinable value. By way of example, the abovementioned limit is a magnification of 500-fold and the predefinable value is a magnification of 490-fold. If the chosen magnification lies in the range between 500-fold and 490-fold, then the deviation of the chosen magnification is less than the predefinable value. If the chosen magnification from the first magnification range deviates from the limit of the second magnification range with the abovementioned deviation and the deviation is less than a predefinable value, then one of the conditions is thus met.

Another condition is that the number of pixels to which the particle beam is intended to be guided falls below the predefinable pixel threshold value.

If the conditions are met, then the following steps are carried out:

- feeding the analog second amplifier signal from the second amplifier unit to a scanning unit of the particle beam apparatus using a fourth signal line, which connects the second amplifier unit to the scanning unit;
- guiding the particle beam of the particle beam apparatus over the object using the scanning unit; and
- imaging, processing and/or analyzing the object with the particle beam.

The system described herein accordingly provides for not carrying out switching, even if the analog second amplifier signal possibly lies in the background noise of the electronic components used in the case of the system described herein. Accordingly, the system described herein teaches exactly the opposite of what is provided by the prior art and what a person skilled in the art would actually carry out. Consequently, the charges and different loadings of electronic components of the scanning device which possibly arise during switching are avoided, and so disturbance effects resulting therefrom are reduced. Therefore, in particular, imaging aberrations that can arise on account of the disturbance effects are avoided.

In one embodiment of the method according to the system described herein, it is additionally or alternatively provided that the following steps are carried out if, firstly, the chosen magnification of the first magnification range deviates from the limit of the second magnification range with the deviation and the deviation is less than a predefinable value, and if, secondly, the number of pixels exceeds the predefinable pixel threshold value or corresponds to the pixel threshold value:

- choosing a magnification from the second magnification range of the particle beam apparatus by driving the first amplifier unit and the second amplifier unit using the control unit of the particle beam apparatus;
- feeding the analog second amplifier signal from the second amplifier unit to the scanning unit of the particle beam apparatus using the fourth signal line, which connects the second amplifier unit to the scanning unit;
- guiding the particle beam of the particle beam apparatus over the object using the scanning unit; and
- imaging, processing and/or analyzing the object with the particle beam.

Consequently, this embodiment of the method according to the system described herein provides method steps which are carried out if the number of pixels exceeds and does not fall below the predefinable pixel threshold value.

In a further embodiment of the method according to the system described herein, it is additionally or alternatively provided that before determining the number of pixels to which the particle beam is intended to be guided, the number of pixels is changed by the number of pixels being adjusted from a first value to a second value. By way of example, the digital-to-analog converter is driven in such a way that the number of pixels is changed from the first value to the second value. In particular, the first value of the number of pixels is 1024. Furthermore, by way of example, the second value of the number of pixels is 4096. It is explicitly pointed out that the invention is not restricted to the values mentioned above. Rather, any values which are suitable may be used. Additionally, this embodiment provides for a ratio of the second value and the first value to one another to be used as the pixel threshold value. By way of example, one of the following ratios is used as the ratio: Greater than or equal to 2, greater than or equal to 4, greater than or equal to 8.

A further method according to the system described herein serves for operating a particle beam apparatus for imaging, processing and/or analyzing an object with a particle beam including charged particles. The charged particles are electrons or ions, for example. The particle beam apparatus is embodied for example as an electron beam apparatus and/or as an ion beam apparatus.

The further method according to the system described herein involves choosing a magnification from a first magnification range of the particle beam apparatus by driving a first amplifier unit and a second amplifier unit using a control unit of the particle beam apparatus. The aforementioned magnification is basically the magnification of the object. To put it another way, the aforementioned magnification is the ratio of the size of the generated image and the actual size of the object to one another. By way of example, the magnification lies in a total range of 10-fold to 2000000-fold. The first magnification range and the second magnification range are subranges of the total range. It is explicitly pointed out that the invention is not restricted to the total range mentioned above. Rather, any total range of magnifications which is suitable may be used.

Furthermore, the further method according to the system described herein involves feeding a digital control signal from the control unit to a digital-to-analog converter of the particle beam apparatus using a first signal line, which connects the control unit to the digital-to-analog converter. The digital control signal serves for guiding the particle beam over the object.

Furthermore, the further method according to the system described herein involves generating an analog control signal on the basis of the digital control signal using the digital-to-analog converter. The analog control signal is passed from the digital-to-analog converter to the first amplifier unit of the particle beam apparatus using a second signal line. The second signal line connects the digital-to-analog converter to the first amplifier unit.

The further method according to the system described herein also includes generating an analog first amplifier signal on the basis of the analog control signal using the first amplifier unit. The analog first amplifier signal is passed from the first amplifier unit to the second amplifier unit of the particle beam apparatus using a third signal line. The first amplifier unit is arranged between the digital-to-analog converter and the second amplifier unit. The third signal line connects the first amplifier unit to the second amplifier unit. An analog second amplifier signal is generated on the basis of the analog first amplifier signal using the second amplifier unit.

Furthermore, the method according to the system described herein involves determining, using the control unit of the particle beam apparatus, whether the chosen magnification from the first magnification range deviates from a limit of a second magnification range with a deviation, wherein the first magnification range and the second magnification range are different. The first magnification range includes magnifications of the particle beam apparatus which are less than magnifications of the particle beam apparatus from the second magnification range. To put it another way, a check is made to establish whether the chosen magnification from the first magnification range is separated by a margin from the limit of the second magnification range and/or lies in a predefinable range between the limit of the second magnification range and a predefinable magnification of the first magnification range. This is discussed in even greater detail further below.

The further method according to the system described herein furthermore provides for determining where the pixels on the surface of the object to which the particle beam is intended to be guided fall below a predefinable pixel size. By way of example, this involves determining whether all pixels or only a portion of the pixels to which the particle beam is intended to be guided fall below a predefinable pixel size. Examples of the predefinable pixel size are given further below.

The further method according to the system described herein then provides for carrying out specific steps without switching the magnification from the first magnification range to a magnification from the second magnification range, if specific conditions are met.

One of the conditions is that the chosen magnification from the first magnification range deviates from the limit of the second magnification range with the abovementioned deviation and that the deviation is less than a predefinable value. The predefinable value is 10, for example, which states that the predefinable value differs from the abovementioned limit by 10 magnification values. The limit and the predefinable value define a limit range. If the chosen magnification lies in this limit range, then the deviation of the chosen magnification is less than the predefinable value. By way of example, the abovementioned limit is a magnification of 500-fold and the predefinable value is a magnification of 490-fold. If the chosen magnification lies in the range between 500-fold and 490-fold, then the deviation of the chosen magnification is less than the predefinable value. If the chosen magnification from the first magnification range deviates from the limit of the second magnification range with the abovementioned deviation and the deviation is less than a predefinable value, then one of the conditions is thus met.

Another condition is that the pixels fall below the predefinable pixel size.

If the conditions are met, then the following steps are carried out:

- feeding the analog second amplifier signal from the second amplifier unit to a scanning unit of the particle beam apparatus using a fourth signal line, which connects the second amplifier unit to the scanning unit;
- guiding the particle beam of the particle beam apparatus over the object using the scanning unit; and
- imaging, processing and/or analyzing the object with the particle beam.

The further method according to the system described herein also provides for not carrying out switching, even if the analog second amplifier signal possibly lies in the background noise of the electronic components used in the case of the system described herein. Accordingly, the system described herein teaches exactly the opposite of what is provided by the prior art and what a person skilled in the art would actually carry out. Consequently, the charges and different loadings of electronic components of the scanning device which possibly arise during switching are avoided, and so disturbance effects resulting therefrom are reduced. Therefore, in particular, imaging aberrations that can arise on account of the disturbance effects are avoided.

In one embodiment of the further method according to the system described herein, it is additionally or alternatively provided that the following steps are carried out if, firstly, the chosen magnification from the first magnification range deviates from the limit of the second magnification range with the deviation mentioned above and the deviation is less than a predefinable value, and if, secondly, the pixels or a portion of the pixels exceed the predefinable pixel size or have the predefinable pixel size:

- choosing a magnification from the second magnification range of the particle beam apparatus by driving the first amplifier unit and the second amplifier unit using the control unit of the particle beam apparatus;
- feeding the analog second amplifier signal from the second amplifier unit to the scanning unit of the particle beam apparatus using the fourth signal line, which connects the second amplifier unit to the scanning unit;
- guiding the particle beam of the particle beam apparatus over the object using the scanning unit; and
- imaging, processing and/or analyzing the object with the particle beam.

In a further embodiment of the further method according to the system described herein, it is additionally or alternatively provided that a pixel size of less than 500 nm, less than 100 nm, less than 20 nm, less than 5 nm or less than 1 nm is used as the predefinable pixel size. It is explicitly pointed out that the invention is not restricted to the pixel sizes mentioned above. Rather, any pixel size which is suitable can be used.

A still further method according to the system described herein serves for operating a particle beam apparatus for imaging, processing and/or analyzing an object with a particle beam including charged particles. The charged particles are electrons or ions, for example. The particle beam apparatus is embodied for example as an electron beam apparatus and/or as an ion beam apparatus.

The still further method according to the system described herein involves choosing a magnification from a first magnification range of the particle beam apparatus by driving a first amplifier unit and a second amplifier unit using a control unit of the particle beam apparatus. The aforementioned magnification is basically the magnification of the object. To put it another way, the aforementioned magnification is the ratio of the size of the generated image and the actual size of the object to one another. By way of example, the magnification lies in a total range of 10-fold to 2000000-fold. The first magnification range and the second magnification range are subranges of the total range. It is explicitly pointed out that the invention is not restricted to the total range mentioned above. Rather, any total range of magnifications which is suitable can be used.

Furthermore, the still further method according to the system described herein involves feeding a digital control signal from the control unit to a digital-to-analog converter of the particle beam apparatus using a first signal line, which connects the control unit to the digital-to-analog converter. The digital control signal serves for guiding the particle beam over the object.

Furthermore, the further method according to the system described herein involves generating an analog control signal on the basis of the digital control signal using the digital-to-analog converter. The analog control signal is passed from the digital-to-analog converter to the first amplifier unit of the particle beam apparatus using a second signal line. The second signal line connects the digital-to-analog converter to the first amplifier unit.

The still further method according to the system described herein also includes generating an analog first amplifier signal on the basis of the analog control signal using the first amplifier unit. The analog first amplifier signal is passed from the first amplifier unit to the second amplifier unit of the particle beam apparatus using a third signal line. The first amplifier unit is arranged between the digital-to-analog converter and the second amplifier unit. The third signal line connects the first amplifier unit to the second amplifier unit. An analog second amplifier signal is generated on the basis of the analog first amplifier signal using the second amplifier unit.

Furthermore, the method according to the system described herein involves determining, using the control unit of the particle beam apparatus, whether the chosen magnification from the first magnification range deviates from a limit of a second magnification range with a deviation, wherein the first magnification range and the second magnification range are different. The first magnification range includes magnifications of the particle beam apparatus which are less than magnifications of the particle beam apparatus from the second magnification range. To put it another way, a check is made to establish whether the chosen magnification from the first magnification range is separated by a margin from the limit of the second magnification range and/or lies in a predefinable range between the limit of the second magnification range and a predefinable magnification of the first magnification range. This is discussed in even greater detail further below.

The still further method according to the system described herein then includes determining, using the control unit, by what distance the particle beam is deflectable in a predefinable direction using a deflection unit in the case of the chosen magnification from the first magnification range of the particle beam apparatus. Furthermore, the control unit checks whether, in the case of a magnification from the second magnification range of the particle beam apparatus, the particle beam is deflectable in the predefinable direction by less than the predetermined distance using the deflection unit.

The still further method according to the system described herein then provides for carrying out specific steps without switching the magnification from the first magnification range to a magnification from the second magnification range, if specific conditions are met.

One of the conditions is that the chosen magnification from the first magnification range deviates from the limit of the second magnification range with the abovementioned deviation and that the deviation is less than a predefinable value. The predefinable value is 10, for example, which states that the predefinable value differs from the abovementioned limit by 10 magnification values. The limit and the predefinable value define a limit range. If the chosen magnification lies in the limit range, then the deviation of the chosen magnification is less than the predefinable value. By way of example, the abovementioned limit is a magnification of 500-fold and the predefinable value is a magnification of 490-fold. If the chosen magnification lies in the range between 500-fold and 490-fold, then the deviation of the chosen magnification is less than the predefinable value. If the chosen magnification from the first magnification range deviates from the limit of the second magnification range with the abovementioned deviation and the deviation is less than a predefinable value, then one of the conditions is thus met.

Another condition is that the particle beam is deflectable in the predefinable direction by less than the predetermined distance using the deflection unit in the case of a magnification from the second magnification range of the particle beam apparatus.

If the conditions are met, then the following steps are carried out:

- feeding the analog second amplifier signal from the second amplifier unit to a scanning unit of the particle beam apparatus using a fourth signal line, which connects the second amplifier unit to the scanning unit;
- guiding the particle beam of the particle beam apparatus over the object using the scanning unit; and
- imaging, processing and/or analyzing the object with the particle beam.

The still further method according to the system described herein also provides for not carrying out switching, even if the analog second amplifier signal possibly lies in the background noise of the electronic components used in the case of the system described herein. Accordingly, the system described herein teaches exactly the opposite of what is provided by the prior art and what a person skilled in the art would actually carry out. Consequently, the charges and different loadings of electronic components of the scanning device which possibly arise during switching are avoided, and so disturbance effects resulting therefrom are reduced. Therefore, in particular, imaging aberrations that can arise on account of the disturbance effects are avoided.

In one embodiment of the still further method according to the system described herein, it is additionally or alternatively provided that the following steps are carried out if, firstly, the chosen magnification from the first magnification range deviates from the limit of the second magnification range with the deviation mentioned above and the deviation is less than a predefinable value, and if, secondly, the particle beam is deflectable in the predefinable direction by more than the predetermined distance or by exactly the predetermined distance using the deflection unit in the case of a magnification from the second magnification range of the particle beam apparatus:

choosing a magnification from the second magnification range of the particle beam apparatus by driving the first amplifier unit and the second amplifier unit using the control unit of the particle beam apparatus;

feeding the analog second amplifier signal from the second amplifier unit to the scanning unit of the particle beam apparatus using the fourth signal line, which connects the second amplifier unit to the scanning unit;

guiding the particle beam of the particle beam apparatus over the object using the scanning unit; and imaging, processing and/or analyzing the object with the particle beam.

In one embodiment of at least one of the methods mentioned above, it is additionally or alternatively provided that a limit between the first magnification range and the second magnification range is used as the limit of the second magnification range, wherein both the first magnification range and the second magnification range adjoin the limit. By way of example, the limit is a value or a subrange which is associated with the first magnification range and/or the second magnification range.

In a further embodiment of at least one of the methods mentioned above, it is additionally or alternatively provided that, firstly a magnification range having magnifications of 10-fold to at least 500-fold is used as the first magnification range, and, secondly, a magnification range having magnifications which are greater than 500-fold is used as the second magnification range. Additionally or alternatively, it is provided that, firstly, a magnification range having magnifications of greater than 500-fold to at least 1000000-fold is used as the first magnification range, and, secondly, a magnification range having magnifications which are greater than 1000000-fold is used as the second magnification range.

In yet another embodiment of at least one of the methods mentioned above, it is additionally or alternatively provided that ions and/or electrons are used as charged particles.

The system described herein also relates to a computer program product having program code which is loadable or loaded into a processor of a particle beam apparatus, wherein the program code, when executed in the processor, controls the particle beam apparatus in such a way that a method having at least one of the aforementioned or following features or having a combination of at least two of the aforementioned or following features is carried out.

The system described herein further relates to a particle beam apparatus for imaging, analyzing and/or processing an object. The particle beam apparatus according to the system described herein includes at least one beam generator for generating a particle beam having charged particles. The charged particles are electrons or ions, for example. The particle beam apparatus according to the system described herein includes at least one objective lens for focusing the particle beam onto the object.

The particle beam apparatus according to the system described herein includes at least one scanning device for scanning the particle beam over the object. Moreover, the particle beam apparatus according to the system described herein includes at least one control unit having a processor in which a computer program product having at least one of the aforementioned or following features or having a combination of at least two of the aforementioned or following features is loaded.

Furthermore, the particle beam apparatus according to the system described herein includes at least one digital-to-analog converter. The digital-to-analog converter is connected to the control unit via a first signal line. Furthermore, at least one first amplifier unit connected to the digital-to-analog converter via a second signal line is provided. The particle beam apparatus according to the system described herein also includes at least one second amplifier unit connected to the first amplifier unit via a third signal line and connected to the scanning device via a fourth signal line. Furthermore, the particle beam apparatus according to the system described herein is provided with at least one detector for detecting interaction particles and/or interaction radiation resulting from an interaction of the particle beam with the object. The particle beam apparatus according to the system described herein includes at least one display device for displaying the image and/or a result of the analysis of the object.

In a further embodiment of the particle beam apparatus according to the system described herein, the beam generator is embodied as a first beam generator and the particle beam is embodied as a first particle beam having first charged particles. Further, the objective lens is embodied as a first objective lens for focusing the first particle beam onto the object. Moreover, the particle beam apparatus according to the system described herein includes at least one second beam generator for generating a second particle beam having second charged particles. Further, the particle beam apparatus according to the system described herein includes at least one second objective lens for focusing the second particle beam onto the object.

In particular, provision is made for the particle beam apparatus to be embodied as an electron beam apparatus and/or as an ion beam apparatus.

BRIEF DESCRIPTION OF DRAWINGS

Further practical embodiments and advantages of the system described herein are described below in association with the drawings. In the figures.

DESCRIPTION OF VARIOUS EMBODIMENTS

The system described herein will now be explained in more detail using particle beam apparatuses in the form of an SEM and in the form of a combination apparatus that includes an electron beam column and an ion beam column.

It is expressly pointed out that the invention can be used in any particle beam apparatus, in particular in any electron beam apparatus and/or any ion beam apparatus.

Figure 1:
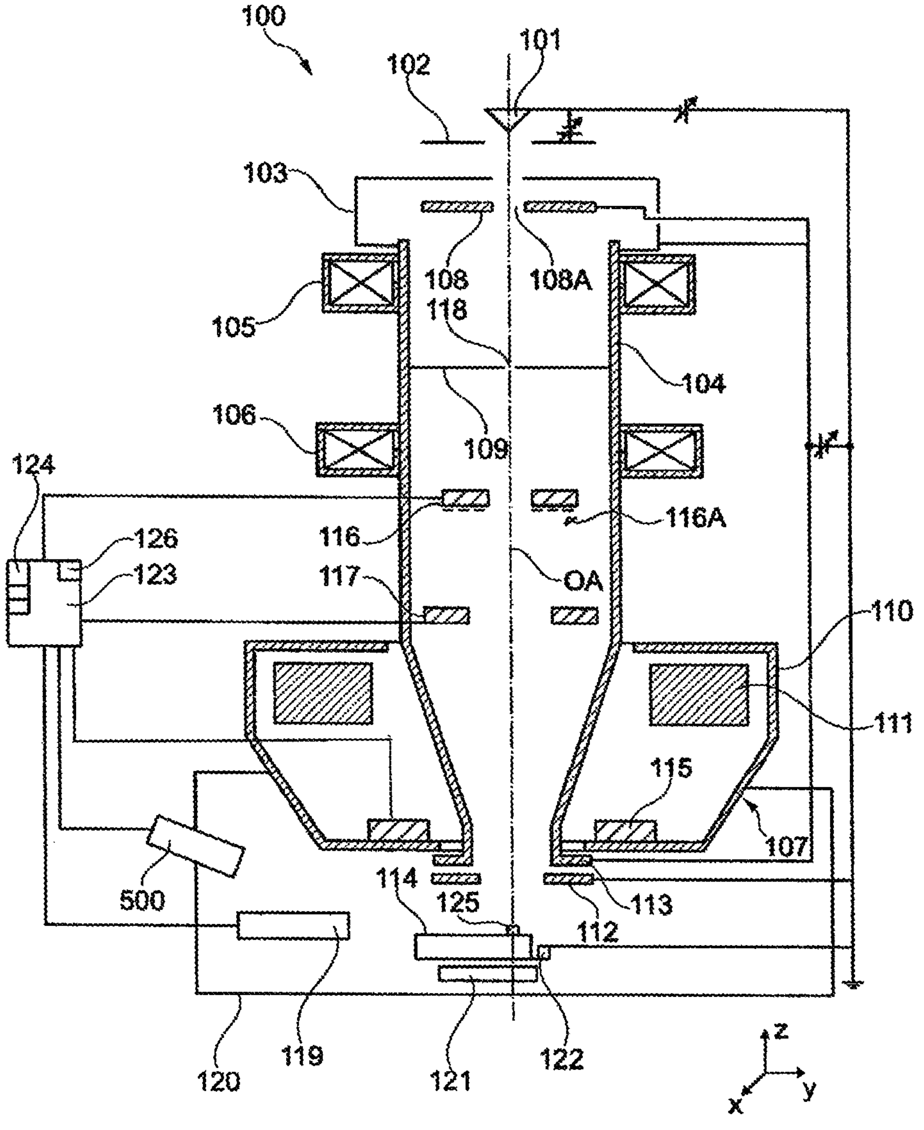
FIG. 1 shows a schematic illustration of a particle beam apparatus according to the system described herein.

FIG. 1 shows a schematic illustration of an SEM 100. The SEM 100 includes a first beam generator in the form of an electron source 101, which is embodied as a cathode. Further, the SEM 100 is provided with an extraction electrode 102 and with an anode 103, which is placed onto one end of a beam guiding tube 104 of the SEM 100. By way of example, the electron source 101 is embodied as a thermal field emitter. However, the invention is not restricted to such an electron source 101. Rather, any electron source which is suitable can be used.

Electrons emerging from the electron source 101 form a primary electron beam. The electrons are accelerated to the anode potential on account of a potential difference between the electron source 101 and the anode 103. In the embodiment illustrated here, the anode potential is 100 V to 35 kV, e.g., 5 kV to 15 kV, in particular 8 kV, relative to a ground potential of a housing of a sample chamber 120. However, alternatively the anode potential could also be at ground potential.

Two condenser lenses, specifically a first condenser lens 105 and a second condenser lens 106, are arranged at the beam guiding tube 104. Here, proceeding from the electron source 101 as viewed in the direction of a first objective lens 107, the first condenser lens 105 is arranged first, followed by the second condenser lens 106. It is expressly pointed out that further embodiments of the SEM 100 can include only a single condenser lens. A first aperture unit 108 is arranged between the anode 103 and the first condenser lens 105. Together with the anode 103 and the beam guiding tube 104, the first aperture unit 108 is at a high voltage potential, specifically the potential of the anode 103, or connected to ground. The first aperture unit 108 has numerous first apertures 108A, of which one is illustrated in FIG. 1. By way of example, two first apertures 108A may be used. Each one of the numerous first apertures 108A has a different aperture diameter. Using an adjustment mechanism (not illustrated), it is possible to set a desired first aperture 108A onto an optical axis OA of the SEM 100. It is expressly pointed out that, in further embodiments, the first aperture unit 108 can be provided with only a single first aperture 108A. In this embodiment, an adjustment mechanism can be absent. The first aperture unit 108 is then designed to be stationary. A stationary second aperture unit 109 is arranged between the first condenser lens 105 and the second condenser lens 106. As an alternative thereto, provision is made for the second aperture unit 109 to be embodied in a movable fashion.

The first objective lens 107 includes pole pieces 110, in which a hole is formed. The beam guiding tube 104 is guided through this hole. A coil 111 is arranged in the pole pieces 110.

An electrostatic retardation device is arranged in a lower region of the beam guiding tube 104. This includes an individual electrode 112 and a tube electrode 113. The tube electrode 113 is arranged at one end of the beam guiding tube 104, the end facing an object 125 that is arranged at an object holder 114 embodied in a movable fashion.

Together with the beam guiding tube 104, the tube electrode 113 is at the potential of the anode 103, while the individual electrode 112 and the object 125 are at a lower potential in relation to the potential of the anode 103. In the present case, the lower potential is the ground potential of the housing of the sample chamber 120. In this manner, the electrons of the primary electron beam can be decelerated to a desired energy which is required for examining the object 125.

The SEM 100 further includes a scanning device 115 that causes the primary electron beam to be deflected and scanned over the object 125. Here, the electrons of the primary electron beam interact with the object 125. As a result of the interaction, interaction particles arise, which are detected. In particular, electrons are emitted from the surface of the object 125—so-called secondary electrons—or electrons of the primary electron beam are backscattered—so-called backscattered electrons—as interaction particles.

The object 125 and the individual electrode 112 can also be at different potentials and potentials different to ground. It is thereby possible to set the location of the retardation of the primary electron beam in relation to the object 125. By way of example, if the retardation is carried out quite close to the object 125, imaging aberrations become smaller.

A detector arrangement that includes a first detector 116 and a second detector 117 is arranged in the beam guiding tube 104 for detecting the secondary electrons and/or the backscattered electrons. Here, the first detector 116 is arranged on the source side along the optical axis OA, while the second detector 117 is arranged on the object side along the optical axis OA in the beam guiding tube 104. The first detector 116 and the second detector 117 are arranged offset from one another in the direction of the optical axis OA of the SEM 100. Both the first detector 116 and the second detector 117 have a respective passage opening, through which the primary electron beam can pass. The first detector 116 and the second detector 117 are approximately at the potential of the anode 103 and of the beam guiding tube 104. The optical axis OA of the SEM 100 extends through the respective passage openings.

The second detector 117 serves principally for detecting secondary electrons. Upon emerging from the object 125, the secondary electrons initially have a low kinetic energy and random directions of motion. Using the strong extraction field emanating from the tube electrode 113, the secondary electrons are accelerated in the direction of the first objective lens 107. The secondary electrons enter the first objective lens 107 approximately parallel. The beam diameter of the beam of the secondary electrons remains small in the first objective lens 107 as well. The first objective lens 107 then has a strong effect on the secondary electrons and to generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 can additionally be embodied with an opposing field grid 116A. The opposing field grid 116A is arranged at the side of the first detector 116 directed toward the object 125. With respect to the potential of the beam guiding tube 104, the opposing field grid 116A has a negative potential such that only backscattered electrons with a high energy pass through the opposing field grid 116A to the first detector 116. In addition or as an alternative thereto, the second detector 117 includes a further opposing field grid, which has an analogous embodiment to the aforementioned opposing field grid 116A of the first detector 116 and which has an analogous function.

Further, the SEM 100 includes in the sample chamber 120 a chamber detector 119, for example an Everhart-Thornley detector or an ion detector, which has a detection surface that is coated with metal and blocks light.

The detection signals generated by the first detector 116, the second detector 117 and the chamber detector 119 are used to generate an image or images of the surface of the object 125.

It is expressly pointed out that the apertures of the first aperture unit 108 and of the second aperture unit 109, as well as the passage openings of the first detector 116 and of the second detector 117, are illustrated in exaggerated fashion. The passage openings of the first detector 116 and of the second detector 117 have an extent perpendicular to the optical axis OA in the range of 0.5 mm to 5 mm. By way of example, the passage openings are of circular design and have a diameter in the range of 1 mm to 3 mm perpendicular to the optical axis OA.

The second aperture unit 109 is configured as a pinhole aperture unit in the embodiment illustrated here and is provided with a second aperture 118 for the passage of the primary electron beam, which has an extent in the range from 5 μm to 500 μm, e.g. 35 μm. As an alternative thereto, provision is made in a further embodiment for the second aperture unit 109 to be provided with a plurality of apertures, which can be displaced mechanically with respect to the primary electron beam or which can be reached by the primary electron beam by the use of electrical and/or magnetic deflection elements. The second aperture unit 109 is embodied as a pressure stage aperture unit that separates a first region, in which the electron source 101 is arranged and in which there is an ultra-high vacuum ($10^{-7}$ hPa to $10^{-12}$ hPa), from a second region, which has a high vacuum ($10^{-3}$ hPa to $10^{-7}$ hPa). The second region is the intermediate pressure region of the beam guiding tube 104, which leads to the sample chamber 120.

The sample chamber 120 is under vacuum. For the purposes of producing the vacuum, a pump (not illustrated) is arranged at the sample chamber 120. In the embodiment illustrated in FIG. 1, the sample chamber 120 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 120 is vacuum-sealed.

The object holder 114 is arranged at a sample stage 122. The sample stage 122 is embodied to be movable in three directions arranged perpendicular to one another, specifically in an x-direction (first stage axis), in a y-direction (second stage axis) and in a z-direction (third stage axis). Moreover, the sample stage 122 can be rotated about two rotation axes which are arranged perpendicular to one another (stage rotation axes). The invention is not restricted to the sample stage 122 described above. Rather, the sample stage 122 can have further translation axes and rotation axes along which or about which the sample stage 122 can move.

The SEM 100 further includes a third detector 121, which is arranged in the sample chamber 120. More precisely, the third detector 121 is arranged downstream of the sample stage 122, viewed from the electron source 101 along the optical axis OA. The sample stage 122, and hence the object holder 114, can be rotated in such a way that the primary electron beam can radiate through the object 125 arranged on the object holder 114. When the primary electron beam passes through the object 125 to be examined, the electrons of the primary electron beam interact with the material of the object 125 to be examined. The electrons passing through the object 125 to be examined are detected by the third detector 121.

Arranged at the sample chamber 120 is a radiation detector 500, which is used to detect interaction radiation, for example x-ray radiation and/or cathodoluminescent light. The radiation detector 500, the first detector 116, the second detector 117, and the chamber detector 119 are connected to a control unit 123, which includes a monitor 124. The third detector 121 is also connected to the control unit 123, which is not illustrated for reasons of clarity. The control unit 123 processes detection signals that are generated by the first detector 116, the second detector 117, the chamber detector 119, the third detector 121 and/or the radiation detector 500 and displays the detection signals in the form of images on the monitor 124.

The control unit 123 furthermore has a database 126, in which data are stored and from which data are read out. Furthermore, the control unit 123 is connected to the scanning device 115.

The control unit 123 of the SEM 100 includes a processor. A computer program product having a program code which, when executed, carries out a method for operating the SEM 100 is loaded in the processor. This is explained in more detail further below.

Figure 2:
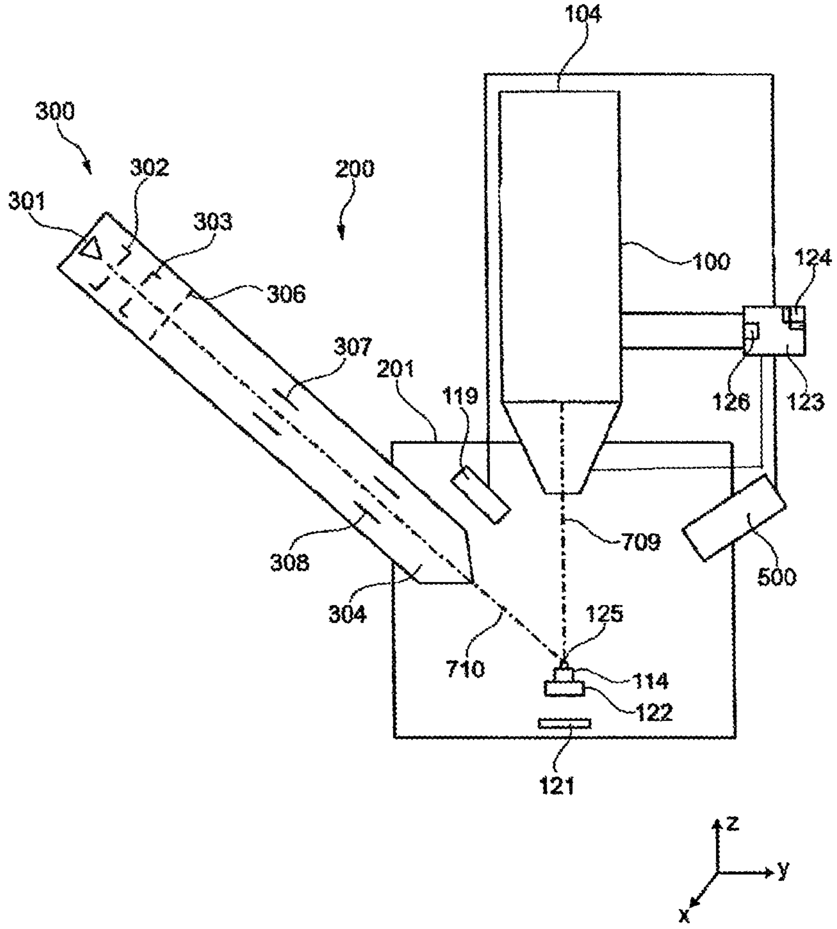
FIG. 2 shows a schematic illustration of a further particle beam apparatus according to the system described herein.

FIG. 2 shows a particle beam apparatus in the form of a combination apparatus 200. The combination apparatus 200 includes two particle beam columns. Firstly, the combination apparatus 200 is provided with the SEM 100, as already illustrated in FIG. 1, but without the sample chamber 120. Rather, the SEM 100 is arranged at a sample chamber 201. The sample chamber 201 is under vacuum. For the purposes of producing the vacuum, a pump (not illustrated) is arranged at the sample chamber 201. In the embodiment illustrated in FIG. 2, the sample chamber 201 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 201 is vacuum-sealed.

Arranged in the sample chamber 201 is the chamber detector 119 which is embodied, for example, in the form of an Everhart-Thornley detector or an ion detector and which has a detection surface coated with metal that blocks light. Further, the third detector 121 is arranged in the sample chamber 201.

The SEM 100 serves to generate a first particle beam, specifically the primary electron beam already described further above, and has the optical axis, already specified above, which is provided with the reference sign 709 in FIG. 2 and which is also referred to as first beam axis below. Secondly, the combination apparatus 200 is provided with an ion beam apparatus 300, which is likewise arranged at the sample chamber 201. The ion beam apparatus 300 likewise has an optical axis, which is provided with the reference sign 710 in FIG. 2 and which is also referred to as second beam axis below.

The SEM 100 is arranged vertically in relation to the sample chamber 201. By contrast, the ion beam apparatus 300 is arranged in a manner inclined by an angle of approximately 0° to 90° in relation to the SEM 100. An arrangement of approximately 50° is illustrated by way of example in FIG. 2. The ion beam apparatus 300 includes a second beam generator in the form of an ion beam generator 301. Ions, which form a second particle beam in the form of an ion beam, are generated by the ion beam generator 301. The ions are accelerated using an extraction electrode 302, which is at a predefinable potential. The second particle beam then passes through an ion optical unit of the ion beam apparatus 300, wherein the ion optical unit includes a condenser lens 303 and a second objective lens 304. The second objective lens 304 ultimately generates an ion probe, which is focused onto the object 125 arranged at an object holder 114. The object holder 114 is arranged at a sample stage 122.

An adjustable or selectable aperture unit 306, a first electrode arrangement 307 and a second electrode arrangement 308 are arranged above the second objective lens 304 (i.e., in the direction of the ion beam generator 301), wherein the first electrode arrangement 307 and the second electrode arrangement 308 are embodied as scanning electrodes. The second particle beam is scanned over the surface of the object 125 using the first electrode arrangement 307 and the second electrode arrangement 308, with the first electrode arrangement 307 acting in a first direction and the second electrode arrangement 308 acting in a second direction, which is counter to the first direction. Thus, scanning is carried out in an x-direction, for example. The scanning in a y-direction perpendicular thereto is brought about by further electrodes (not illustrated), which are rotated by 90°, at the first electrode arrangement 307 and at the second electrode arrangement 308.

As explained above, the object holder 114 is arranged at the sample stage 122. In the embodiment shown in FIG. 2, the sample stage 122 is also embodied to be movable in three directions arranged perpendicular to one another, specifically in an x-direction (first stage axis), in a y-direction (second stage axis) and in a z-direction (third stage axis). Moreover, the sample stage 122 can be rotated about two rotation axes which are arranged perpendicular to one another (stage rotation axes).

The distances illustrated in FIG. 2 between the individual units of the combination apparatus 200 are illustrated in exaggerated fashion in order to better illustrate the individual units of the combination apparatus 200.

Arranged at the sample chamber 201 is a radiation detector 500, which is used to detect interaction radiation, for example x-ray radiation and/or cathodoluminescent light. The radiation detector 500 is connected to a control unit 123, which includes a monitor 124.

The control unit 123 processes detection signals that are generated by the first detector 116, the second detector 117 (not illustrated in FIG. 2), the chamber detector 119, the third detector 121 and/or the radiation detector 500 and displays said detection signals in the form of images on the monitor 124.

The control unit 123 furthermore has a database 126, in which data are stored and from which data are read out. Furthermore, the control unit 123 is connected to the scanning device 115.

The control unit 123 of the combination apparatus 200 includes a processor. A computer program product having a program code which, when executed, carries out a method for operating the combination apparatus 200 is loaded in the processor. This is explained in more detail further below.

Figure 3:
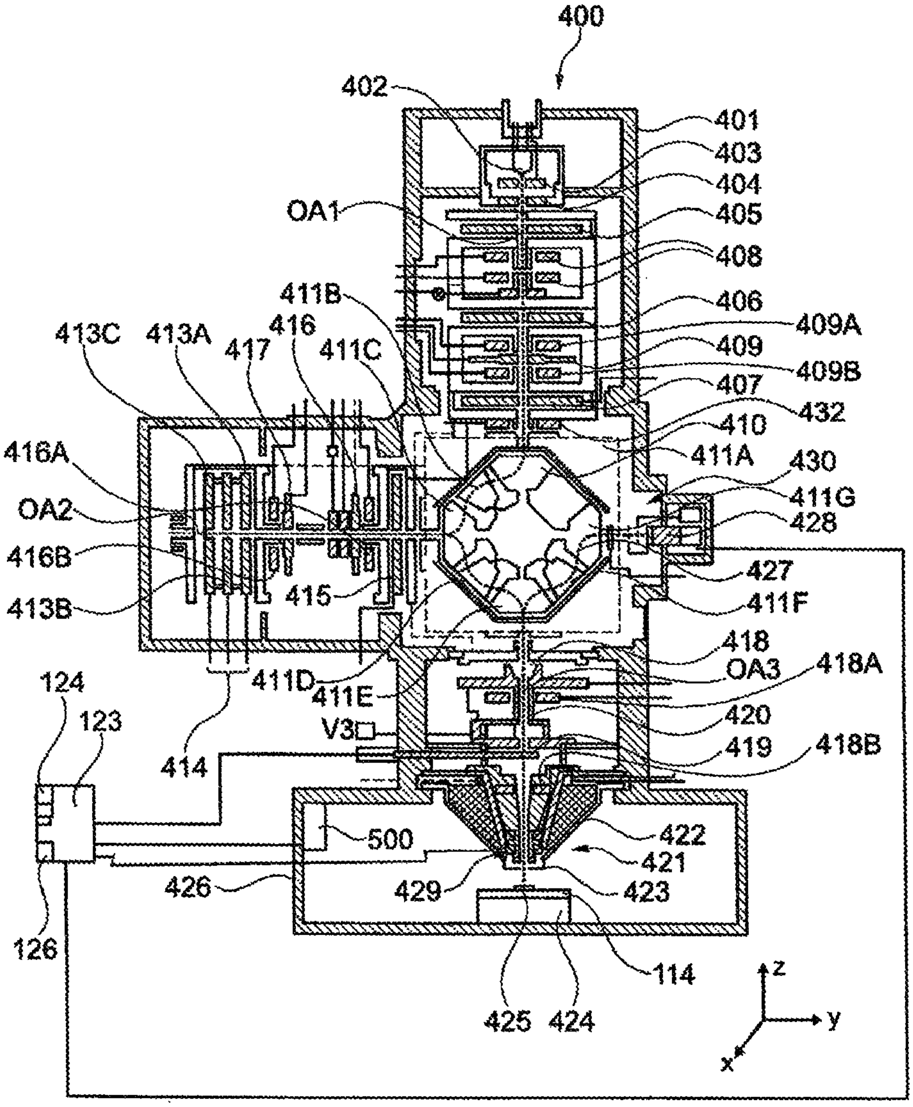
FIG. 3 shows a schematic illustration of yet another particle beam apparatus according to the system described herein.

FIG. 3 is a schematic illustration of a further embodiment of a particle beam apparatus according to the system described herein. This embodiment of the particle beam apparatus is provided with the reference sign 400 and includes a mirror corrector for correcting, e.g., chromatic and/or spherical aberrations. The particle beam apparatus 400 includes a particle beam column 401, which is embodied as an electron beam column and which substantially corresponds to an electron beam column of a corrected SEM. However, the particle beam apparatus 400 is not restricted to an SEM with a mirror corrector. Rather, the particle beam apparatus can include any type of corrector units.

The particle beam column 401 includes a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 on account of a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is set along the beam path using a beam guiding device. The beam guiding device of this embodiment includes a source setting unit with two magnetic deflection units 408 arranged along the first optical axis OA1. Moreover, the particle beam apparatus 400 includes electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are set for the purposes of setting the particle beam with respect to the axis of the third electrostatic lens 407 and the entrance window of a beam deflection device 410. The first electrostatic beam deflection unit 409, the first multi-pole unit 409A and the second multi-pole unit 409B can interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 includes a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and the particle beam is deflected by the beam deflection device 410 in the direction of a second optical axis OA2. The beam deflection is performed using the first magnetic sector 411A, the second magnetic sector 411B, and the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 is provided by deflection of the particle beam at an angle of 90°. Hence, the third optical axis OA3 extends coaxially with respect to the first optical axis OA1. However, it is pointed out that the particle beam apparatus 400 according to the invention described here is not restricted to deflection angles of 90°. Rather, any suitable deflection angle can be selected by the beam deflection device 410, for example 70° or 110°, such that the first optical axis OA1 does not extend coaxially with respect to the third optical axis OA3. With respect to further details of the beam deflection device 410, reference is made to WO 2002/067286 A2.

After the particle beam has been deflected by the first magnetic sector 411A, the second magnetic sector 411B, and the third magnetic sector 411C, the particle beam is guided along the second optical axis OA2. The particle beam is guided to an electrostatic mirror 414 and travels on a path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 includes a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, the electrons of the particle beam are deflected to the third optical axis OA3 by the third magnetic sector 411C, the fourth magnetic sector 411D, and the fifth magnetic sector 411E.

The electrons of the particle beam emerge from the beam deflection device 410 and the electrons are guided along the third optical axis OA3 to an object 425 that is intended to be examined and is arranged in an object holder 114. On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam guiding tube 420.

Using the objective lens 421, the particle beam is focused into a focal plane in which the object 425 is arranged. The object holder 114 is arranged at a movable sample stage 424. The movable sample stage 424 is arranged in a sample chamber 426 of the particle beam apparatus 400. The sample stage 424 is embodied to be movable in three directions arranged perpendicular to one another, specifically in an x-direction (first stage axis), in a y-direction (second stage axis) and in a z-direction (third stage axis). Moreover, the sample stage 424 can be rotated about two rotation axes which are arranged perpendicular to one another (stage rotation axes).

The sample chamber 426 is under vacuum. For the purposes of producing the vacuum, a pump (not illustrated) is arranged at the sample chamber 426. In the embodiment illustrated in FIG. 3, the sample chamber 426 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 426 is vacuum-sealed.

The objective lens 421 can be embodied as a combination of a magnetic lens 422 and a sixth electrostatic lens 423. The end of the beam guiding tube 420 can furthermore be an electrode of an electrostatic lens. After emerging from the beam guiding tube 420, particles of the particle beam apparatus are decelerated to a potential of the object 425. The objective lens 421 is not restricted to a combination of the magnetic lens 422 and the sixth electrostatic lens 423. Rather, the objective lens 421 can assume any suitable form. By way of example, the objective lens 421 can also be embodied as a purely magnetic lens or as a purely electrostatic lens.

The particle beam which is focused onto the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 includes a first analysis detector 419, which is arranged between the beam deflection device 410 and the objective lens 421 along the beam path. Secondary electrons travelling in directions oriented at a large angle with respect to the third optical axis OA3 are detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—enter the beam deflection device 410 and are deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 generates detection signals which are largely generated by emitted secondary electrons. The detection signals which are generated by the first analysis detector 419 are guided to a control unit 123 and are used to obtain information about the properties of the interaction region of the focused particle beam with the object 425. In particular, the focused particle beam is scanned over the object 425 using a scanning device 429. Using the detection signals generated by the first analysis detector 419, an image of the scanned region of the object 425 can then be generated and displayed on a display unit. The display unit is, for example, a monitor 124 that is arranged at the control unit 123.

The second analysis detector 428 is also connected to the control unit 123. Detection signals of the second analysis detector 428 are passed to the control unit 123 and used to generate an image of the scanned region of the object 425 and to display the image on a display unit. The display unit is, for example, the monitor 124 that is arranged at the control unit 123.

Arranged at the sample chamber 426 is a radiation detector 500, which is used to detect interaction radiation, for example x-ray radiation and/or cathodoluminescent light. The radiation detector 500 is connected to the control unit 123, which includes the monitor 124. The control unit 123 processes detection signals of the radiation detector 500 and displays the detection signals in the form of images on the monitor 124.

The control unit 123 furthermore has a database 126, in which data are stored and from which data are read out. Furthermore, the control unit 123 is connected to the scanning device 429.

The control unit 123 of the particle beam apparatus 400 includes a processor. A computer program product having a program code which, when executed, carries out a method for operating the particle beam apparatus 400 is loaded in the processor.

Figure 4:
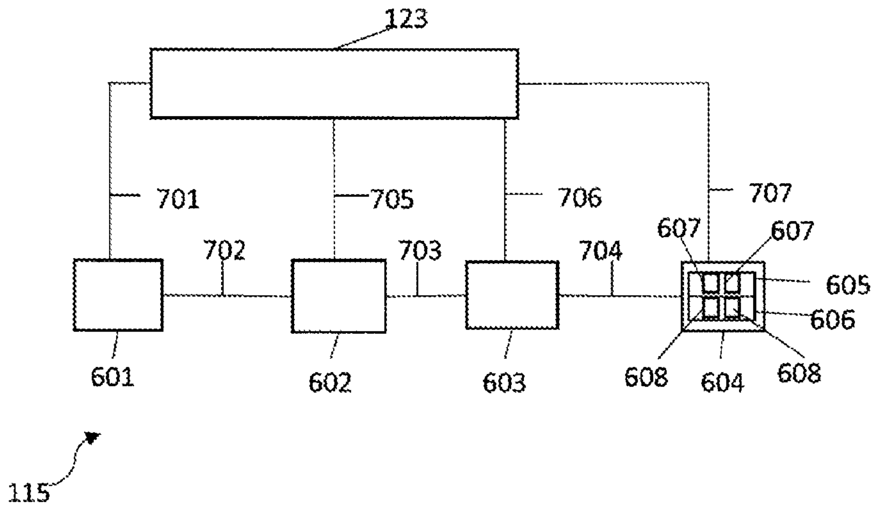
FIG. 4 shows a schematic illustration of a scanning device of a particle beam apparatus according to the system described herein.

FIG. 4 shows one embodiment of the scanning device 115 of the SEM 100 in accordance with FIG. 1. This will be explained below. The same correspondingly applies to the scanning device 429 of the particle beam apparatus 400 in accordance with FIG. 3

The scanning device 115 includes a digital-to-analog converter 601. The digital-to-analog converter 601 is conductively connected to the control unit 123 via a first signal line 701. The digital-to-analog converter 601 is embodied for example as a digital-to-analog converter having an 8-bit resolution, having a 12-bit resolution or having a 16-bit resolution. It is explicitly pointed out that the invention is not restricted to the digital-to-analog converter described above. Rather, any digital-to-analog converter which is suitable can be used.

Furthermore, the scanning device 115 includes a first amplifier unit 602 and a second amplifier unit 603. The first amplifier unit 602 is embodied as a preamplifier, for example. Furthermore, the second amplifier unit 603 is embodied as a main amplifier, for example. The first amplifier unit 602 is conductively connected to the digital-to-analog converter 601 via a second signal line 702. Furthermore, the first amplifier unit 602 is conductively connected to the second amplifier unit 603 via a third signal line 703. Accordingly, the first amplifier unit 602 is arranged between the digital-to-analog converter 601 and the second amplifier unit 603. Furthermore, the scanning device 115 includes a scanning unit 604, which is conductively connected to the second amplifier unit 603 via a fourth signal line 704.

The control unit 123 does not just serve for driving the digital-to-analog converter 601. Rather, the control unit 123 is conductively connected to the first amplifier unit 602 via a first control line 705. Moreover, the control unit 123 is conductively connected to the second amplifier unit 603 via a second control line 706. Furthermore, the control unit 123 is conductively connected to the scanning unit 604 via a third control line 707.

The scanning unit 604 includes a first coil unit 605 and a second coil unit 606. Using the first coil unit 605 and the second coil unit 606, the primary electron beam is scanned over the surface of the object 125. The first coil unit 605 acts in a first direction and the second coil unit 606 acts in a second direction oriented perpendicular to the first direction. The first coil unit 605 includes a first coil pair 607. By contrast, the second coil unit 606 includes a second coil pair 608.

Figure 5:
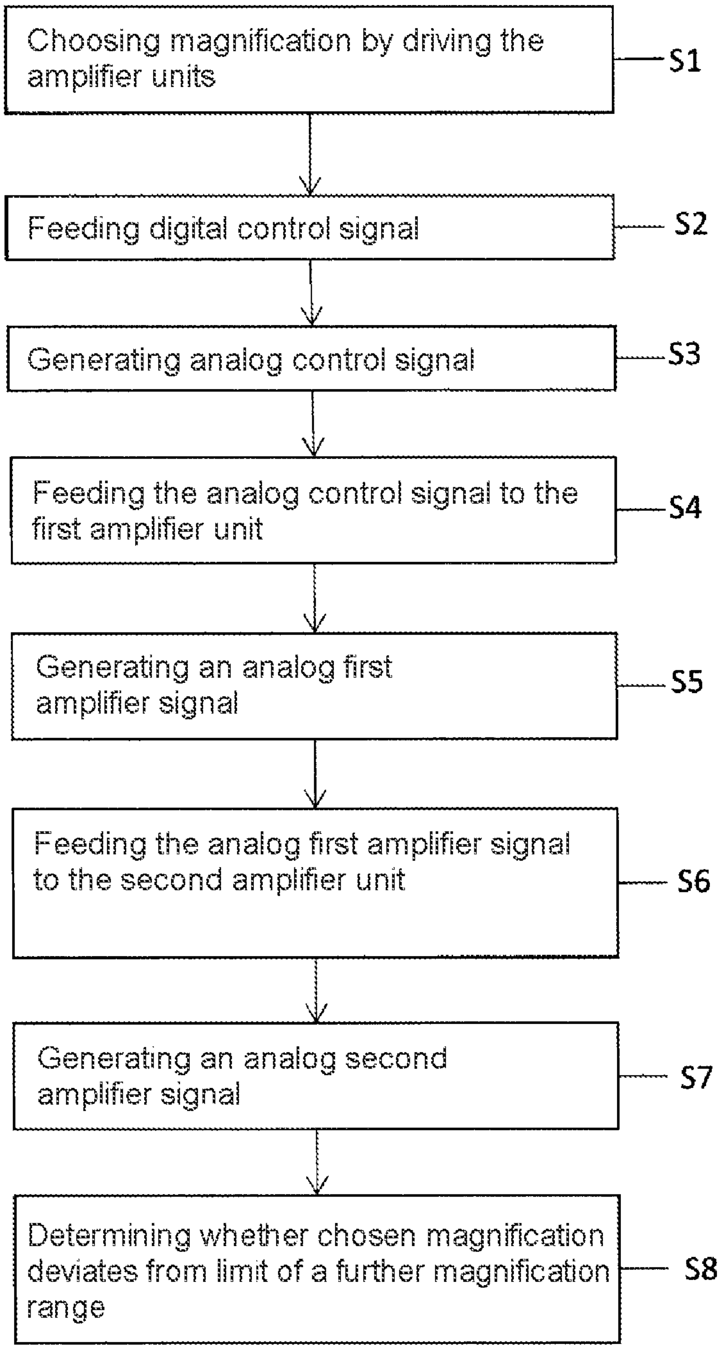
FIG. 5 shows a flow diagram of one embodiment of a method according to the system described herein.

FIG. 5 shows a first part of one embodiment of the method according to the system described herein, which is carried out by the SEM 100 in accordance with FIG. 1. The same correspondingly applies with respect to carrying out this embodiment of the method according to the system described herein in the case of the further particle beam apparatuses 200, 400 that are mentioned above.

A method step S1 involves choosing a magnification of the SEM 100. The magnification is basically the magnification of the object 125. To put it another way, the magnification of the object 125 is the ratio of the size of the generated image of the object 125 to the actual size of the object 125. By way of example, the magnification lies in a total range of 10-fold to 2000000-fold. By way of example, the total range has four subranges, namely a first magnification range, a second magnification range, a third magnification range and a fourth magnification range. The first magnification range includes for example magnifications in the range of 10-fold to 500-fold. By contrast, the second magnification range includes magnifications in the range of greater than 500-fold to 10000-fold. Furthermore, the third magnification range includes magnifications in the range of greater than 10000-fold to 1000000-fold. Moreover, the fourth magnification range includes magnifications in the range of greater than 1000000-fold to 2000000-fold. It is explicitly pointed out that the invention is not restricted to the abovementioned subdivision of the magnification ranges. Rather, any subdivision which is suitable can be used for the subdivision of the magnification ranges. In method step S1, then, a magnification is chosen from one of the magnification ranges. By way of example, the magnification range is the first magnification range. The choosing is effected by driving the first amplifier unit 602 and the second amplifier unit 603 using the control unit 123.

A method step S2 involves feeding a digital control signal from the control unit 123 to the digital-to-analog converter 601 using the first signal line 701. The digital control signal serves for guiding the primary electron beam over the object 125. To put it another way, the digital control signal serves for guiding the primary electron beam onto a location of the object 125 which is intended to be imaged, processed and/or analyzed.

Method step S3 then involves generating an analog control signal on the basis of the digital control signal using the digital-to-analog converter 601.

A further method step S4 involves passing the analog control signal from the digital-to-analog converter 601 to the first amplifier unit 602 using the second signal line 702. Furthermore, method step S5 involves generating an analog first amplifier signal on the basis of the analog control signal using the first amplifier unit 602.

Method step S6 involves passing the analog first amplifier signal from the first amplifier unit 602 to the second amplifier unit 603 using the third signal line 703. This is followed by generating an analog second amplifier signal on the basis of the analog first amplifier signal using the second amplifier unit 603 in method step S7.

Method step S8 involves determining, using the control unit 123, whether the chosen magnification from the corresponding magnification range deviates from a limit of a further magnification range with a deviation. Here, the aforementioned magnification ranges are different. By way of example, if the chosen magnification is from the first magnification range and the further magnification range is the second magnification range, then the first magnification range and the second magnification range are different. The first magnification range includes magnifications of the SEM 100 which are less than magnifications of the SEM 100 from the second magnification range. To put it another way, method step S8 involves checking whether the chosen magnification from the corresponding magnification range (for example the first magnification range) is separated by a margin from the limit of the further magnification range (for example of the second magnification range) and/or lies in a predefinable range between the limit of the further magnification range (for example of the second magnification range) and a predefinable magnification of the corresponding magnification range (for example of the first magnification range). A limit between the corresponding magnification range (for example the first magnification range) and the further magnification range (for example the second magnification range) is used as the limit of the further magnification range (for example of the second magnification range), wherein both the corresponding magnification range (for example the first magnification range) and the further magnification range (for example the second magnification range) adjoin the limit. In particular, the limit is a value or a subrange which is associated with the corresponding magnification range (for example the first magnification range) and/or the further magnification range (for example the second magnification range). The predefinable magnification mentioned above (i.e. the predefinable value mentioned above) is for example a separating margin of 10 magnification values from the limit mentioned above. The limit and the predefinable value define a limit range. If the chosen magnification lies in the limit range, then the deviation of the chosen magnification is less than the predefinable value. By way of example, the limit mentioned above is a magnification of 500-fold and the predefinable value is a magnification of 490-fold. If the chosen magnification lies in the range between 500-fold and 490-fold, then the deviation of the chosen magnification is less than the predefinable value.

Figure 6:
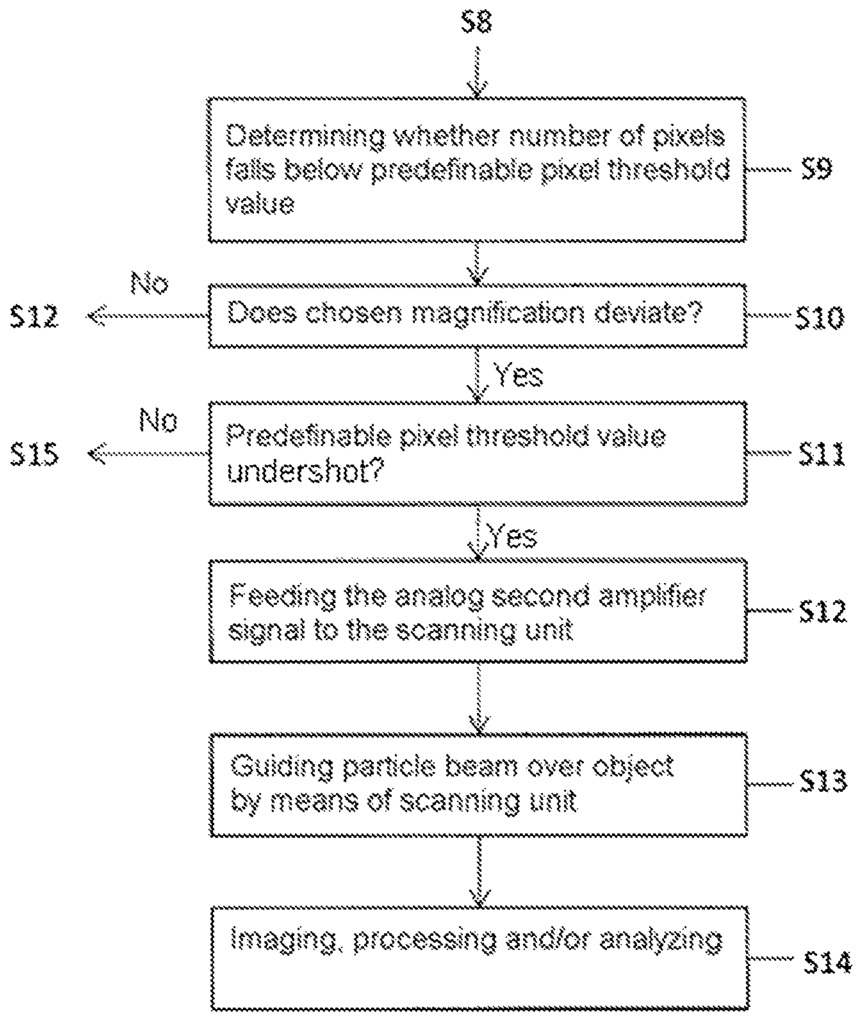
FIG. 6 shows a flow diagram of further method steps of a method according to the system described herein.

FIG. 6 shows a second part of the embodiment of the method according to the system described herein. Method step S9 involves determining, using the control unit 123, whether the number of pixels on the surface of the object 125 to which the primary electron beam is intended to be guided falls below a predefinable pixel threshold value. By way of example, the pixel threshold value is a predefinable number of pixels, in particular 4096 or 16384. As an alternative thereto, provision is made for the pixel threshold value to be a ratio of a first number of pixels and a second number of pixels to one another. By way of example, before the abovementioned process of determining the number of pixels, the number of pixels is changed by the number of pixels being adjusted from a first value to a second value using the control unit 123. To put it another way, the number of pixels to which the particle beam is intended to be guided is changed from the first value to the second value using the control unit 123. By way of example, the digital-to-analog converter 601 is driven by the control unit 123 in such a way that the number of pixels is changed from the first value to the second value. In particular, the first value of the number of pixels is 1024. Furthermore, by way of example, the second value of the number of pixels is 4096. It is explicitly pointed out that the invention is not restricted to the values mentioned above. Rather, any values which are suitable can be used. In addition, provision is made, for example, of a ratio of the second value and the first value to one another to be used as the pixel threshold value. By way of example, one of the following ratios is used as the ratio: greater than or equal to 2, greater than or equal to 4, greater than or equal to 8.

Method step S10 then involves checking whether the chosen magnification from the corresponding magnification range (for example the first magnification range) deviates from the limit of the further magnification range (for example of the second magnification range) with the deviation mentioned above and whether the deviation is less than the predefinable value. As mentioned above, the predefinable value is for example a separating margin of 10 magnification values from the limit mentioned above. The limit and the predefinable value define the limit range. If the chosen magnification lies in this limit range, the deviation of the chosen magnification is less than the predefinable value. If the chosen magnification from the corresponding magnification range (for example the first magnification range) deviates from the limit of the further magnification range (for example of the second magnification range) with the deviation mentioned above and the deviation is less than the predefinable value, then method step S11 is carried out. By way of example, the limit mentioned above is a magnification of 500-fold and the predefinable value is a magnification of 490-fold. If the chosen magnification lies in the range between 500-fold and 490-fold, then the deviation of the chosen magnification is less than the predefinable value.

Method step S11 involves checking whether the number of pixels falls below the predefinable pixel threshold value. If the number of pixels falls below the predefinable pixel threshold value, then method steps S12 to S14 are carried out without switching the magnification from the corresponding magnification range (for example the first magnification range) to a magnification from the further magnification range (for example the second magnification range). Method step S12 involves feeding the analog second amplifier signal from the second amplifier unit 603 to the scanning unit 604 using the fourth signal line 704. Furthermore, method step S13 involves guiding the primary electron beam over the object 125 using the scanning unit 604. Furthermore, method step S14 involves imaging, processing and/or analyzing the object 125 with the primary electron beam.

If it is established in method step S10 that the chosen magnification from the corresponding magnification range (for example the first magnification range) deviates from the limit of the further magnification range (for example of the second magnification range) and the deviation is greater than the predefinable value, then method steps S12 to S14 are carried out after method step S10.

Figure 7:
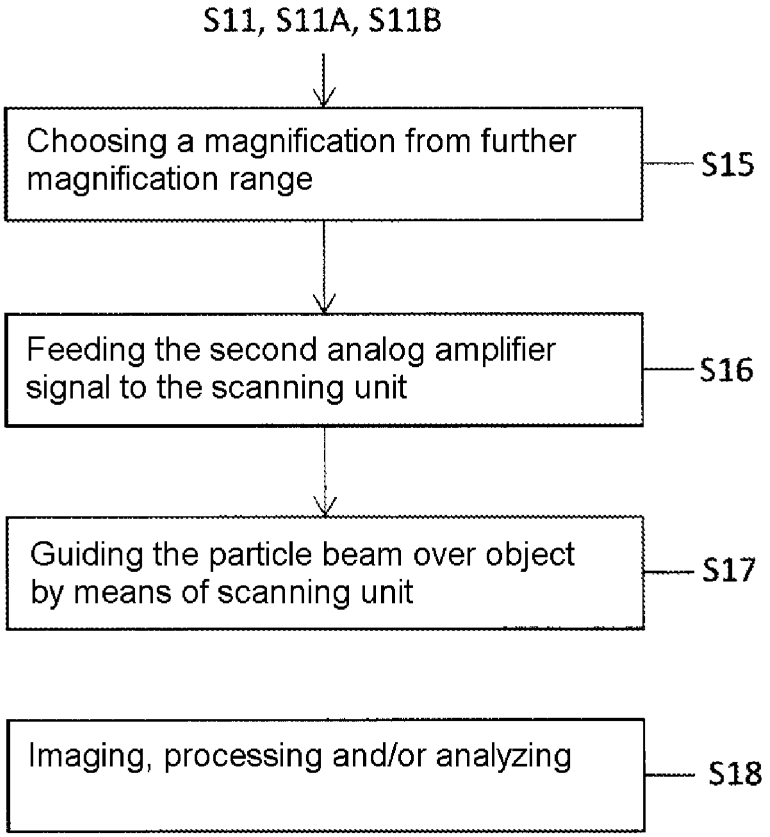
FIG. 7 shows a flow diagram of still further method steps of a method according to the system described herein.

FIG. 7 shows a third part of the embodiment of the method according to the system described herein. If it is established in method step S11 that the number of pixels exceeds the predefinable pixel threshold value, then method steps S15 to S18 are carried out. Method step S15 involves choosing a magnification from a different magnification range, in particular the further magnification range (for example the second magnification range), of the SEM 100 by driving the first amplifier unit 602 and the second amplifier unit 603 using the control unit 123. Furthermore, method step S16 involves feeding the analog second amplifier signal from the second amplifier unit 603 to the scanning unit 604 using the fourth signal line 704. Method step S17 involves guiding the primary electron beam over the object 125 using the scanning unit 604. Moreover, method step S18 involves imaging, processing and/or analyzing the object 125 with the primary electron beam.

Figure 8:
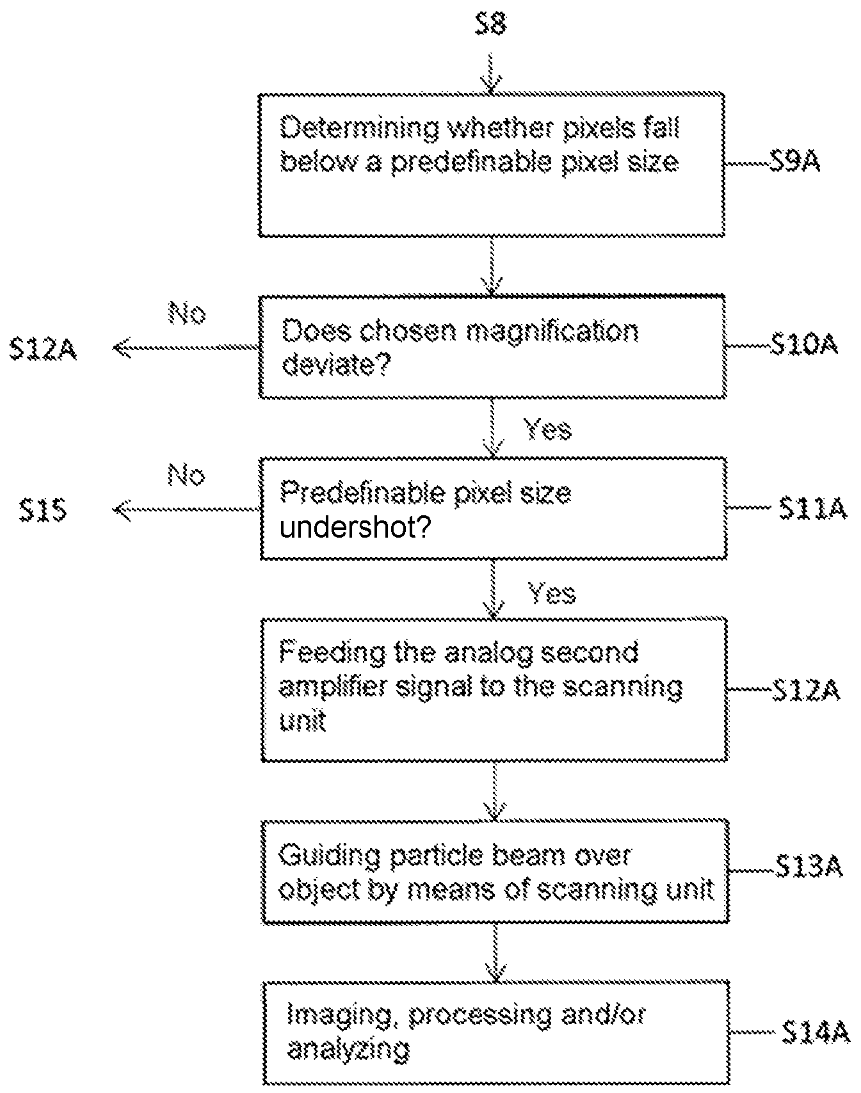
FIG. 8 shows a flow diagram of a further embodiment of a method according to the system described herein.

FIG. 8 shows a further embodiment of the method according to the system described herein, which is carried out by the SEM 100 in accordance with FIG. 1. The same correspondingly applies with respect to carrying out this embodiment of the method according to the system described herein in the case of the further particle beam apparatuses 200 and 400 mentioned above.

The further embodiment of the method according to the system described herein likewise includes method steps S1 to S8, which are illustrated in FIG. 5 and are explained above. Reference is made to the corresponding explanations. The explanations also apply to the further embodiment of the method according to the system described herein.

Method step S8 is followed by method step S9A in the further embodiment of the method according to the system described herein. Method step S9A involves determining, using the control unit 123, whether all pixels or a portion of the pixels on the surface of the object 125 to which the primary electron beam is intended to be guided fall below a predefinable pixel size. By way of example, a pixel size of less than 500 nm, less than 100 nm, less than 20 nm, less than 5 nm or less than 1 nm is used as the predefinable pixel size. It is explicitly pointed out that the invention is not restricted to the pixel sizes mentioned above. Rather, any pixel size which is suitable can be used.

Method step S10A then involves checking whether the chosen magnification from the corresponding magnification range (for example the first magnification range) deviates from the limit of the further magnification range (for example of the second magnification range) with the deviation mentioned above and whether the deviation is less than a predefinable value. The predefinable value is for example a separating margin of 10 magnification values from the limit mentioned above. The limit and the predefinable value define a limit range. If the chosen magnification lies in this limit range, the deviation of the chosen magnification is less than the predefinable value. If the chosen magnification from the corresponding magnification range (for example the first magnification range) deviates from the limit of the further magnification range (for example of the second magnification range) with the deviation mentioned above and the deviation is less than the predefinable value, then method step S11A is carried out.

Method step S11A involves checking whether pixels on the surface of the object 125 to which the particle beam is intended to be guided fall below the predefinable pixel size. If the pixels fall below the predefinable pixel size, then method steps S12A to 514A are carried out without switching the magnification from the corresponding magnification range (for example the first magnification range) to a magnification from the further magnification range (for example the second magnification range). Method step S12A involves feeding the analog second amplifier signal from the second amplifier unit 603 to the scanning unit 604 using the fourth signal line 704. Furthermore, method step S13A involves guiding the primary electron beam over the object 125 using the scanning unit 604. Furthermore, method step S14A involves imaging, processing and/or analyzing the object 125 with the primary electron beam.

If it is established in method step S10A that the chosen magnification from the corresponding magnification range (for example the first magnification range) deviates from the limit of the further magnification range (for example of the second magnification range) and the deviation is greater than the predefinable value, then method steps S12A to S14A are carried out after method step S10A.

If it is established in method step S11A that the pixels or a portion of the pixels exceed the predefinable pixel size or have the predefinable pixel size, then method steps S15 to S18 in accordance with FIG. 7 are carried out. Reference is made to the explanations further above, which apply in this case, too.

Figure 9:
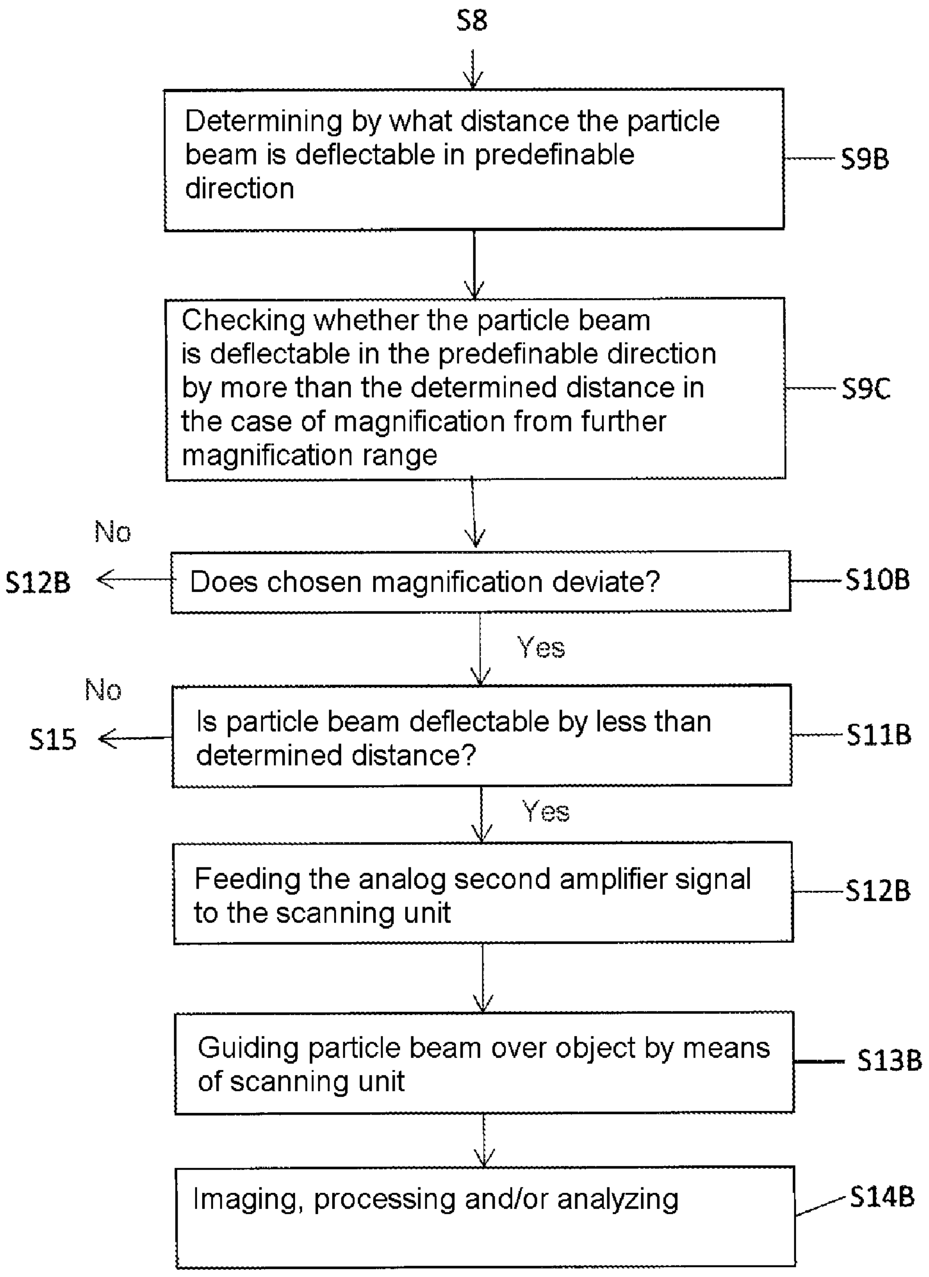
FIG. 9 shows a flow diagram of one embodiment of a method according to the system described herein.

FIG. 9 shows a still further embodiment of the method according to the system described herein, which is carried out by the SEM 100 in accordance with FIG. 1. The same correspondingly applies in respect of carrying out this embodiment of the method according to the system described herein in the case of the further particle beam apparatuses 200, 400 that are mentioned above.

The still further embodiment of the method according to the system described herein likewise includes method steps S1 to S8, which are illustrated in FIG. 5 and are explained further above. Reference is made to the corresponding explanations. The explanations also apply to the still further embodiment of the method according to the system described herein.

Method step S8 is followed by method step S9B in the further embodiment of the method according to the system described herein. Method step S9B involves determining, using the control unit 123, by what distance the primary electron beam is deflectable in a predefinable direction using the scanning unit 604 in the case of the chosen magnification from the corresponding magnification range (for example the first magnification range) of the SEM 100. Furthermore, method step S9C involves checking, using the control unit 123, whether the primary electron beam is deflectable in the predefinable direction by more than the predetermined distance using the scanning unit 604 in the case of a magnification from the further magnification range (for example the second magnification range) of the SEM 100.

Method step S10B then involves checking whether the chosen magnification from the corresponding magnification range (for example the first magnification range) deviates from the limit of the further magnification range (for example of the second magnification range) with the deviation mentioned above and whether the deviation is less than a predefinable value. The predefinable value is for example a separating margin of 10 magnification values from the limit mentioned above. The limit and the predefinable value define a limit range. If the chosen magnification lies in the limit range, the deviation of the chosen magnification from the limit is less than the predefinable value. If the chosen magnification from the corresponding magnification range (for example the first magnification range) deviates from the limit of the further magnification range (for example of the second magnification range) with the deviation mentioned above and the deviation is less than the predefinable value, then method step S11B is carried out.

Method step S11B involves checking whether the primary electron beam is deflectable in the predefinable direction by less than the determined distance using the scanning unit 604 in the case of a magnification from the further magnification range (for example the second magnification range) of the SEM 100. If the primary electron beam is deflectable by less than the determined distance, then method steps S12B to S14B are carried out without switching the magnification from the corresponding magnification range (for example the first magnification range) to a magnification from the further magnification range (for example the second magnification range). Method step S12B involves feeding the analog second amplifier signal from the second amplifier unit 603 to the scanning unit 604 using the fourth signal line 704. Furthermore, method step S13B involves guiding the primary electron beam over the object 125 using the scanning unit 604. Furthermore, method step S14B involves imaging, processing and/or analyzing the object 125 with the primary electron beam.

If it is established in method step S10B that the chosen magnification from the corresponding magnification range (for example the first magnification range) deviates from the limit of the further magnification range (for example of the second magnification range) and the deviation is greater than the predefinable value, then method steps S12B to S14B are carried out after method step S10B.

If it is established in method step S11B that the primary electron beam is deflectable in the predefinable direction by more than or by exactly the determined distance using the scanning unit 604 in the case of a magnification from the further magnification range (for example the second magnification range) of the SEM 100, then method steps S15 to S18 in accordance with FIG. 7 are carried out. Reference is made to the explanations further above, which apply in this case, too.

The system described herein accordingly provides for not carrying out switching with regard to the magnification, even if the analog second amplifier signal possibly lies in the background noise of the electronic components of the scanning device 115 which are used in the case of the system described herein. Accordingly, the system described herein teaches exactly the opposite of what is provided by the prior art and what a person skilled in the art would actually carry out.

The features of the invention disclosed in the present description, in the drawings and in the claims may be essential for the realization of the invention in the various embodiments thereof both individually and in arbitrary combinations. The invention is not restricted to the described embodiments. It can be varied within the scope of the claims and taking into account the knowledge of the relevant person skilled in the art.

The invention claimed is:

1. A method for operating a particle beam apparatus, comprising:

choosing a magnification from a first magnification range of the particle beam apparatus by driving a first amplifier unit and a second amplifier unit using a control unit of the particle beam apparatus;

feeding a digital control signal from the control unit to a digital-to-analog converter of the particle beam apparatus using a first signal line, which connects the control unit to the digital-to-analog converter, wherein the digital control signal is used for guiding the particle beam over the object;

generating an analog control signal on the basis of the digital control signal using the digital-to-analog converter;

feeding the analog control signal from the digital-to-analog converter to the first amplifier unit of the particle beam apparatus using a second signal line which connects a digital-to-analog converter to the first amplifier unit;

generating an analog first amplifier signal on the basis of the analog control signal using the first amplifier unit;

feeding the analog first amplifier signal from the first amplifier unit to the second amplifier unit of the particle beam apparatus using a third signal line, wherein the first amplifier unit is arranged between the digital-to-analog converter and the second amplifier unit and wherein the third signal line connects the first amplifier unit to the second amplifier unit;

generating an analog second amplifier signal on the basis of the analog first amplifier signal using the second amplifier unit;

determining, using the control of the particle beam apparatus, whether the chosen magnification from the first magnification range deviates from a limit of a second magnification range with a deviation, wherein the first magnification range and the second magnification range are different, wherein the first magnification range includes magnifications of the particle beam apparatus which are less than magnifications of the particle beam apparatus from the second magnification range;

determining whether a number of pixels on the surface of the object to which the particle beam is intended to be guided falls below a predefinable pixel threshold value; and if the chosen magnification deviates from the limit of the second magnification range and the deviation is less than a predefinable value and if the number of pixels falls below the predefinable pixel threshold value, carrying out the following steps without switching the magnification to a magnification from the second magnification range:

feeding the analog second amplifier signal from the second amplifier unit to a scanning unit of the particle beam apparatus using a fourth signal line, which connects the second amplifier unit to the scanning unit;

guiding the particle beam of the particle beam apparatus over the object using the scanning unit; and imaging, processing and/or analyzing the object with the particle beam.

2. The method as claimed in claim 1, further comprising:

the chosen magnification deviates from the limit of the second magnification range and the deviation is less than a predefinable value, and if the number of pixels exceeds the predefinable pixel threshold value, carrying out the following steps:

choosing a magnification from the second magnification range of the particle beam apparatus by driving the first amplifier unit and the second amplifier unit using the control unit of the particle beam apparatus;

feeding the analog second amplifier signal from the second amplifier unit to the scanning unit of the particle beam apparatus using the fourth signal line, which connects the second amplifier unit to the scanning unit;

guiding the particle beam of the particle beam apparatus over the object using the scanning unit; and imaging, processing and/or analyzing the object with the particle beam.

3. The method as claimed in claim 1, wherein further comprising:

before determining the number of pixels to which the particle beam is intended to be guided, changing the number of pixels by the number of pixels being adjusted from a first value to a second value; and using a ratio of the second value to the first value as a pixel threshold value.

4. The method as claimed in claim 3, wherein a ratio of greater than or equal to 2 is used as the ratio, or a ratio of greater than or equal to 4 is used as the ratio, or a ratio of greater than or equal to 8 is used as the ratio.

5. The method as claimed in claim 1, wherein a limit between the first magnification range and the second magnification range is used as the limit of the second magnification range, wherein both the first magnification range and the second magnification range adjoin the limit.

6. The method as claimed in claim 1, wherein a magnification range having magnifications of 10-fold to at least 500-fold is used as the first magnification range, and a magnification range having magnifications which are greater than 500-fold is used as the second magnification range or a magnification range having magnifications of greater than 500-fold to at least 1000000-fold is used as the first magnification range, and a magnification range having magnifications which are greater than 1000000-fold is used as the second magnification range.

7. The method as claimed in claim 1, wherein ions and/or electrons are used as charged particles.

8. A computer program product comprising program code which is loadable into a processor and which, when executed, controls a particle beam apparatus by performing the following steps:

choosing a magnification from a first magnification range of the particle beam apparatus by driving a first amplifier unit and a second amplifier unit using a control unit of the particle beam apparatus;

feeding a digital control signal from the control unit to a digital-to-analog converter of the particle beam apparatus using a first signal line, which connects the control unit to the digital-to-analog converter, wherein the digital control signal is used for guiding the particle beam over the object;

generating an analog control signal on the basis of the digital control signal using the digital-to-analog converter;

feeding the analog control signal from the digital-to-analog converter to the first amplifier unit of the particle beam apparatus using a second signal line which connects a digital- to-analog converter to the first amplifier unit;

generating an analog first amplifier signal on the basis of the analog control signal using the first amplifier unit;

feeding the analog first amplifier signal from the first amplifier unit to the second amplifier unit of the particle beam apparatus using a third signal line, wherein the first amplifier unit is arranged between the digital-to-analog converter and the second amplifier unit and wherein the third signal line connects the first amplifier unit to the second amplifier unit;

generating an analog second amplifier signal on the basis of the analog first amplifier signal using the second amplifier unit;

determining, using the control unit of the particle beam apparatus, whether the chosen magnification from the first magnification range deviates from a limit of a second magnification range with a deviation, wherein the first magnification range and the second magnification range are different, wherein the first magnification range includes magnifications of the particle beam apparatus which are less than magnifications of the particle beam apparatus from the second magnification range;

determining whether a number of pixels on the surface of the object to which the particle beam is intended to be guided falls below a predefinable pixel threshold value; and if the chosen magnification deviates from the limit of the second magnification range and the deviation is less than a predefinable value and if the number of pixels falls below the predefinable pixel threshold value, carrying out the following steps without switching the magnification to a magnification from the second magnification range:

feeding the analog second amplifier signal from the second amplifier unit to a scanning unit of the particle beam apparatus using a fourth signal line, which connects the second amplifier unit to the scanning unit;

guiding the particle beam of the particle beam apparatus over the object using the scanning unit; and imaging, processing and/or analyzing the object with the particle beam.

* * * * *